United States Patent
Akram

Patent Number: 6,121,070
Date of Patent: Sep. 19, 2000

[54] FLIP CHIP DOWN-BOND: METHOD AND APPARATUS

[75] Inventor: Salman Akram, Boise, Id.

[73] Assignee: Micron Technology, Inc., Boise, Id.

[21] Appl. No.: 09/198,737

[22] Filed: Nov. 24, 1998

Related U.S. Application Data

[62] Division of application No. 08/758,931, Dec. 3, 1996.

[51] Int. Cl.[7] .......................... H01L 21/44; H01L 21/48; H01L 21/50
[52] U.S. Cl. ...................... 438/108; 438/106; 438/107
[58] Field of Search ................................ 438/108, 107, 438/106

[56] References Cited

U.S. PATENT DOCUMENTS

| | | |
|---|---|---|
| 5,120,678 | 6/1992 | Moore et al. |
| 5,311,059 | 5/1994 | Banerji et al. |
| 5,677,575 | 10/1997 | Maeta et al. |
| 5,786,230 | 7/1998 | Anderson et al. |
| 5,915,170 | 6/1999 | Raab et al. |

FOREIGN PATENT DOCUMENTS

| | | |
|---|---|---|
| 5-166949 | 7/1993 | Japan. |
| 5-235191 | 9/1993 | Japan. |

*Primary Examiner*—Kevin M. Picardat
*Assistant Examiner*—D. Mark Collins
*Attorney, Agent, or Firm*—Trask, Britt & Rossa

[57] ABSTRACT

A flip-chip semiconductor device comprises a carrier substrate having a conductor pattern on at least one side and at least one semiconductor die with an active surface and an opposed ground surface. A conductive backing plate is conductively bonded to the ground surface. The active surface faces and is electrically connected to the conductor pattern of the carrier substrate. A conductive down-bond connection is provided between the backing plate and a ground connection or reference potential connection. The backing plate is preferably rigid and can be manipulated for indirect alignment of the die or dice carried thereon relative to the substrate.

20 Claims, 4 Drawing Sheets

FLIP CHIP DOWN-BOND: METHOD AND APPARATUS

CROSS REFERENCE TO RELATED APPLICATION

This application is a divisional of application Ser. No. 08/758,931, filed Dec. 3, 1996, pending.

BACKGROUND OF THE INVENTION

1. Field of the Invention

This invention relates generally to semiconductor chips mounted to carrier substrates. More particularly, this invention pertains to apparatus and methods for providing a down-bond for flip-chip technology or, stated another way, for providing an electrical connection between the back side of a semiconductor die which has been face-down electrically connected to traces on a carrier substrate.

2. State of the Art

There are a number of reasons for providing a ground connection between the back side of a semiconductor die or chip and circuitry on a carrier substrate to which the active side of the die is electrically connected. Such a connection provides a threshold potential very useful for characterizing the die and enables access from the substrate to the die for controlling the die characteristics or for trouble-shooting of the die.

A relatively recent innovation in semiconductor chip technology is the flip-chip, a packaging configuration in which contacts on the active surface of an integrated circuit die are bonded directly to conductive traces of an insulated carrier substrate by, e.g., solder bumps, conductive epoxy or conductor filled epoxy. The advantages of the flip-chip connection when properly executed may include an increase in production volume, device reliability and improved device performance at reduced cost in comparison to leadframe mounted, transfer-molded dice or even bare dice bare-bonded to a carrier substrate and having wire bonds extending to the substrate traces. Automated production is enhanced in comparison to wire-bonded dice because all active connections between each die and carrier substrate may be made simultaneously. This advantage is particularly significant in multi-chip modules (MCMs) employing a large number of dice on a single carrier substrate, examples of such devices including without limitation single in-line memory modules (SIMMs) and dual in-line memory modules (DIMMs) as well as multi-chip printed circuit boards (PCBs) carrying processor, memory, logic and other dice in combination.

However, providing a connection between the ground plane of the flip-chip and the substrate ground is made more difficult, because the flip-chip ground plane faces away from the substrate. Thus, conventional placement of a down-bond requires an additional time-consuming operation.

Because of the miniature scale of such chips and the relatively fragile circuit connections thereon, extreme care must be taken to avoid breakage or non-connection of required electrical circuits, whether formed of wire, solder bumps, conductive epoxy, TAB leads, laser pantography formed wires, or other means. Physical handling of such small chips and the component parts thereof presents significant problems. For forming very large scale integrated (VLSI) circuits incorporating a large number of circuits in a chip requiring many connections, alignment of the chip with a carrier substrate may be extremely difficult, particularly with the minute conductive flip-chip bumps and fine pitch (spacing) therebetween employed with increasing frequency. In addition, the back side of each chip must be separately connected to the substrate to establish a ground or reference potential.

In U.S. Pat. No. 5,311,059 of Banerji et al., a backplane grounded flip-chip integrated circuit die is disclosed in which a continuous film or coating of an electrically conductive material is applied to the back side of the flip-chip die and over concave peripheral fillets of an insulative underfill material disposed between the active surface of the chips and the carrier substrate, the surface of the substrate, and the ground connection (terminal) of the substrate. The technique does not address the problems encountered in handling chips without damage, or the difficulties encountered in precisely aligning conductively-bumped chips for face-down joining to the substrate conductors. Furthermore, Banerji does not provide any technique for simultaneously handling, aligning and bonding multiple flip-chip dice or of making a single, common ground or reference connection to the substrate for more than one die.

BRIEF SUMMARY OF THE INVENTION

According to the invention, a flip-chip semiconductor device is provided in which a discrete conductive backing plate is superimposed on and conductively bonded to the back side of a flip-chip integrated circuit (IC) die. The flip-chip die has a front side with an active surface which faces and is electrically joined by an array of conductively-bumped bond pads to a cooperative, matching (mirror image) metallization pattern or conductive traces on a carrier substrate such as a PCB. The opposing or back side of the flip-chip die typically comprises a common ground or other circuit which is also to be electrically bonded to one or more conductors carried by the substrate. A down-bond electrically connecting the back side of the die through the conductive backing plate with the substrate conductor completes the desired ground circuit, reference potential circuit, test circuit or other desired circuit.

The invention may be applied at the single die, multiple die, and wafer-scale level. For example, all the dice of a single-in-line memory module (SIMM) may be backed by a single conductive backing plate which is connected to the board by a single down-bond to provide the reference potential or ground.

As noted above, the active surface of each flip-chip die is typically connected to the substrate by reflowed solder bumps, heat-cured conductive or conductor-filled epoxy, and the like. Such electrical connections may also be made using a Z-axis anisotropic conductive adhesive film or tape, or even by a tape automated bonding (TAB) connection, wherein a dielectric film carries conductive traces. The backing plate and down-bond of the invention are useful irrespective of the type of flip-chip active surface connections employed.

In a preferred embodiment, the back side of the die or dice is precisely aligned with and conductively bonded to the backing plate prior to connecting each die by its face-down active surface to the substrate. The backing plate may then be used for physical manipulation, e.g. as an alignment and support fixture for the die or dice relative to and for alignment with conductors on a substrate such as a PCB or other higher-level package.

The down-bond of the invention may be provided in a variety of ways, e.g. a wire bond, TAB connection, conductive or conductor-filled adhesives, or the connection may be fabricated integrally with the backing plate so that only a single connection need be made to effect the down-bond.

In the following discussion, the term "carrier substrate" refers to a circuit board, package or other means for structurally supporting and/or electrically connecting an integrated circuit die to other dice, to other components, or to external electrical connections. The substrate may be, e.g., a printed circuit board formed of paper-phenolic, FR-4, CEM, reinforced polyimide or polyester, ceramic or fluoropolymeric material, or molybdenum.

The term "integrated circuit" or "IC" refers to an active miniaturized electrical circuit which may include transistors, diodes, resistors, capacitors and/or other electrical components formed on or in a layer of semiconductor material such as silicon or gallium arsenide and accessed by inputs/outputs typically called "bond pads."

The above-mentioned and other features and advantages of the invention will be readily understood by reading the following description in conjunction with the accompanying figures of the drawings, wherein like reference numerals have been applied to designate like elements throughout the several views.

DETAILED DESCRIPTION OF THE INVENTION

Figure 1:
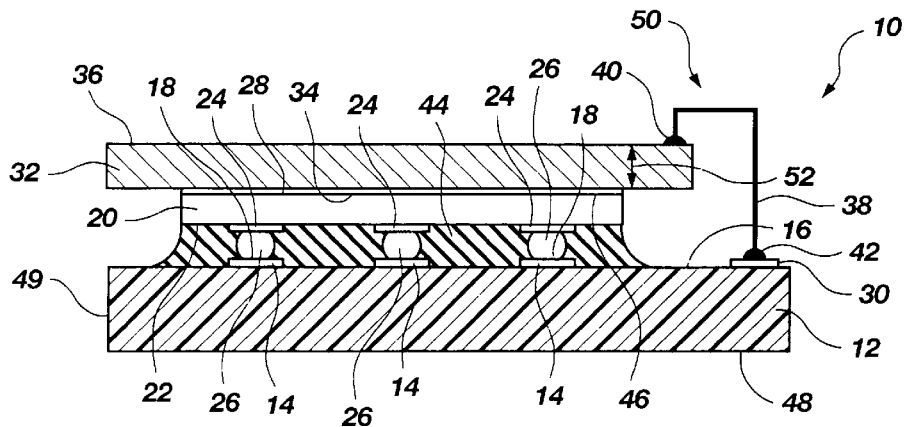
FIG. 1 is a cross-sectional view of a first preferred embodiment of a semiconductor device according to the present invention including a flip-chip mounted to a substrate and back-bonded to a conductive backing plate and including a down-bond connection.

With reference to the drawings, and particularly to FIG. 1, a first embodiment of a flip-chip semiconductor device 10 is shown. The views are enlarged, and some dimensions of components shown in the drawings are further exaggerated for enhanced visualization.

A carrier substrate 12 is pictured with a metallized conductor pattern 14 on at least a first side 16 and including input/output connection surfaces 18. A flip-chip semiconductor die 20 has an active surface 22 shown with input/output (I/O) or "bond" pads 24 facing the carrier substrate 12. I/O connection surfaces or terminals 18 of conductor pattern 14 are shown connected to I/O pads 24 by solder or other conductive bumps 26 to electrically connect the circuits of the flip-chip semiconductor die 20 to the matching metallization or conductor pattern 14 on the carrier substrate 12 and to physically secure the flip-chip semiconductor die 20 to the carrier substrate 12.

Following connection of the die active surface 22 to the metallization or conductor pattern 14 of the carrier substrate 12, the space between the flip-chip semiconductor die 20 and the carrier substrate 12, i.e. surrounding solder bumps 26, is typically (although optionally) filled with a nonconductive polymeric material 44, as known in the art, to mutually isolate the conductive connections, protect the active die surface from environmental effects (dust, moisture, etc.) and assist in mechanically strengthening and joining the die to the substrate. The polymeric material 44 is typically an epoxy curable by heat or radiation, although other suitable materials are known in the art.

The opposed surface, i.e. back side 28 of flip-chip semiconductor die 20, is advantageously connected through a conductive backing plate 32 and a down-bond connection 50 to a ground or reference potential connection 30 on the carrier substrate 12 to complete what is herein noted as a second circuit. As shown in FIG. 1, a first side 34 of electrically conductive backing plate 32 is bonded to the die back side 28, typically defined as a "non-active" ground side or ground plane of the flip-chip semiconductor die 20. A second side 36, opposed to the first side 34 of the backing plate 32, is electrically connected to reference potential connection 30 by a down-bond connection 50 shown as comprising wire 38 and wirebonds 40 and 42. The wire 38 may be of gold, silver, aluminum, or alloys thereof, all as known in the art.

The backing plate 32 is preferably formed of a conductive metal sheet or other material which has a high electrical conductivity useful for a ground circuit or reference potential circuit. Thus, the backing plate 32 may comprise aluminum, silver, gold, copper or other metal or alloys thereof. Backing plate 32 may also comprise an insulative or dielectric substrate of any material typically employed in carrier substrates and carrying a continuous sheet or a pattern of such a conductive material thereon. Finally, the backing plate 32 can also be made of a semiconductor such as silicon. The plate-to-die bond 46 may comprise a conductive adhesive such as metal filled epoxy, including as an example a silver-filled epoxy commonly used for die-attach to paddle-type lead frames, a conductor-filled urethane, metallic solder paste or even a Z-axis anisotropic conductive adhesive film, all as known in the art. The back side 28 of flip-chip semiconductor die 20 may be pre-coated with a conductive film at the wafer level to enhance the electrical connection and mechanical bond by any process known in the art including CVD, PECVD, sputtering, printing, etc.

The backing plate 32 may be coextensive with the back side 28 of flip-chip semiconductor die 20, or may be somewhat larger or smaller than the back side 28. Preferably, the backing plate 32 at least overcovers the entire back side 28 of each flip-chip semiconductor die 20 to which it is bonded, and most preferably extends laterally beyond the die periphery, as shown.

In a preferred embodiment, the flip-chip semiconductor dice 20 are aligned, precisely placed and back-bonded to the backing plate 32 prior to forming the die-to-substrate flip-chip connections. The backing plate 32 may then be directly manipulated by handling equipment to indirectly control the positioning and alignment of the dice 20 in a subsequent processing operation to effect connections to carrier substrates or other higher-level packaging.

The second, i.e. reverse side 48 of the carrier substrate 12 or an edge 49 thereof may include circuit connections, not shown, for interconnection with a higher-level package, another PCB and/or other circuit components, e.g., on another PCB such as a motherboard.

Figure 2:
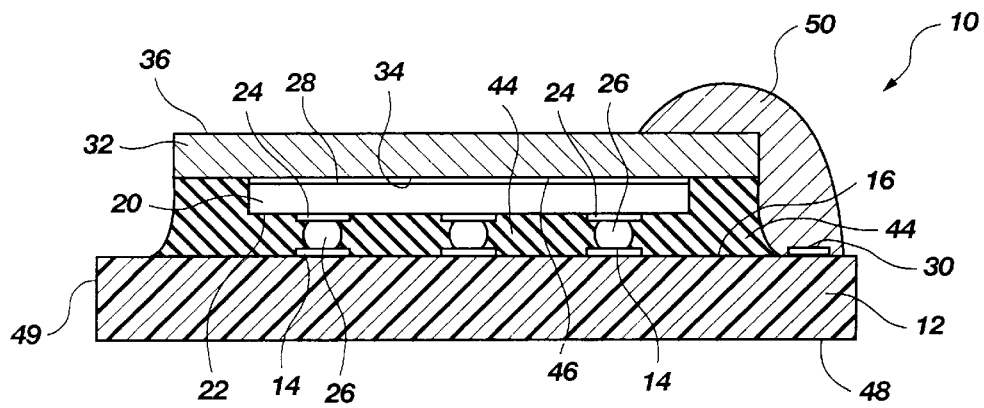
FIG. 2 is a cross-sectional view of a second preferred embodiment of a semiconductor device according to the invention including a flip-chip mounted to a substrate and back-bonded to a conductive backing plate and including a down-bond connection.

Turning now to FIG. 2, a single flip-chip semiconductor die 20 is shown connected to a carrier substrate 12 as in FIG. 1, with a conductive backing plate 32 connected to the back side 28 of the die. In this embodiment, the down-bond connection 50 comprises a body of conductive material or conductor-containing material which may be applied as a viscous fluid or gel and thereafter hardened or otherwise cured to a stable dimensional state. The conductive down-bond 50 may comprise a metallic solder, metal-filled polymer such as the aforementioned silver epoxy adhesive, or other conductive material. The conductive down-bond 50 forms an electrical connection the backing second side 36 of the backing plate 32 and the ground or reference potential connection 30 on the corner substrate 12.

Figure 3:
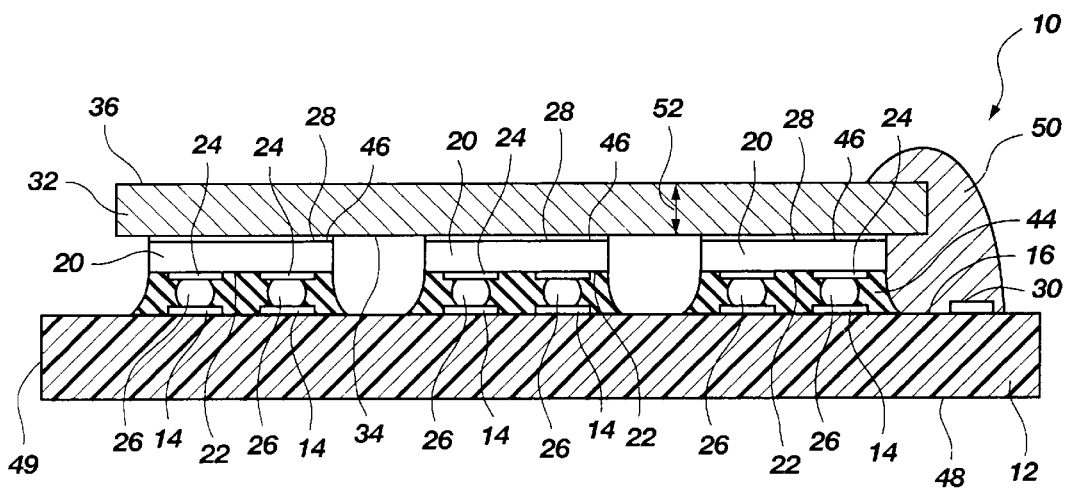
FIG. 3 is a cross-sectional view of a third preferred embodiment of a semiconductor device of the invention including multiple flip-chip dice mounted on a substrate and back-bonded to a single discrete conductive backing plate electrically connected to the substrate by a down-bond of the invention.

FIG. 3 illustrates the invention as applied to a flip-chip semiconductor device 10 formed of multiple flip-chip semiconductor dice 20. A single backing plate 32 is bonded to the back side 28 of the dice 20, and a single conductor down-bond 50 between the second side 36 of the backing plate 32 and the carrier substrate 12 provides the ground or reference potential circuit for all of the dice. The down-bond connection 50 is illustrated as comparable to that of FIG. 2, although any other type of suitable connection may be employed.

Figure 9:
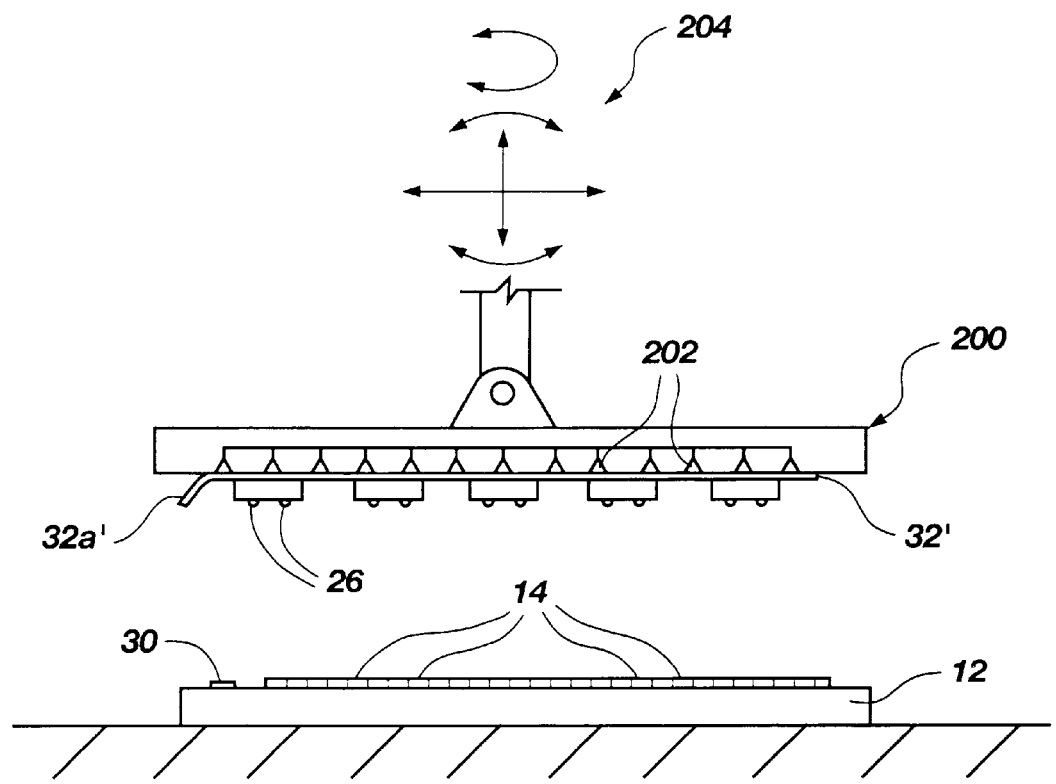
FIG. 9 is a schematic side view of a flexible-film backing plate embodiment of the invention being manipulated by a vacuum chuck.

The backing plate 32 is preferably rigid for supporting a plurality of attached flip-chip semiconductor dice 20. The backing plate 32 as well as the back sides 28 of the flip-chip semiconductor dice 20 may be provided with precise dimensions or machine recognizable fiducial marks such that a large number of flip-chip semiconductor dice 20 may be accurately aligned and supported on a single backing plate and the plate in turn accurately aligned with a carrier substrate. Toward this end, a pattern recognition system such as employed in the industry, typically for automated flip-chip aligner-bonders, may be employed in handling the dice and backing plate. The active surfaces 22 of the flip-chip semiconductor dice 20 may thus be accurately aligned as a group to correspond to mating metallization or conductor patterns 14 on the carrier substrate 12. Manipulative control of the backing plate 32 with attached flip-chip semiconductor dice 20 permits a large number of die-to-substrate flip-chip connections to be made more accurately and in a single step per substrate. The thickness 52 of backing plate 32 may vary widely, but (if a metal sheet) typically is about 3 to about 100 mils for rigidity without undue thickness. In general, the minimum value of plate thickness 52 for rigidity is a function of overall plate size. Rigidity is also a function of the material used. For supporting a large number of dice, a backing plate 32 of greater bending resistance is required. Of course, if rigidity is not required, backing plate 32 may be made extremely thin. To achieve precise die and backing plate alignment and afford good handling characteristics of the bonded dice and plate equivalent to that provided by a rigid backing plate, it is contemplated (see FIG. 9) that a metal film-type plate 32' (thickness exaggerated for clarity) may be held by vacuum ports 202 on a planar-surfaced vacuum chuck 200 for bonding of flip-chip semiconductor dice 20 thereto, and the vacuum chuck 200 used to manipulate (see arrows 204) the dice/plate assembly for flip-chip bonding to the carrier substrate 12, after which the metal film type plate 32' is released and an integral portion 32a' of the film configured as a lead may be bonded to a reference potential connection 30 by conductive adhesive, thermo-compression bonding, or other means known in the art.

As shown in FIG. 3, the backing plate 32 overcovers the flip-chip semiconductor dice 20 and thus also acts as a protective layer against physical damage to the flip-chip semiconductor dice 20 during handling. Backing plates 32 may also be used to support and safely store preplaced flip-chip semiconductor dice 20 awaiting incorporation in an MCM. For example, dice/plate assemblies might be vertically stored in racks until needed to complete an MCM.

In addition, the backing plate 32 to which the flip-chip semiconductor dice 20 are joined acts as a heat sink to assist in protecting the dice from heat-induced damage during subsequent thermal bonding processes and assists in cooling of the device during operation.

Further, the entire backing plate 32, when connected by a down-bond connection 50, is at a uniform potential, and thus provides an enlarged upper surface easily accessed by test probes.

Figure 4:
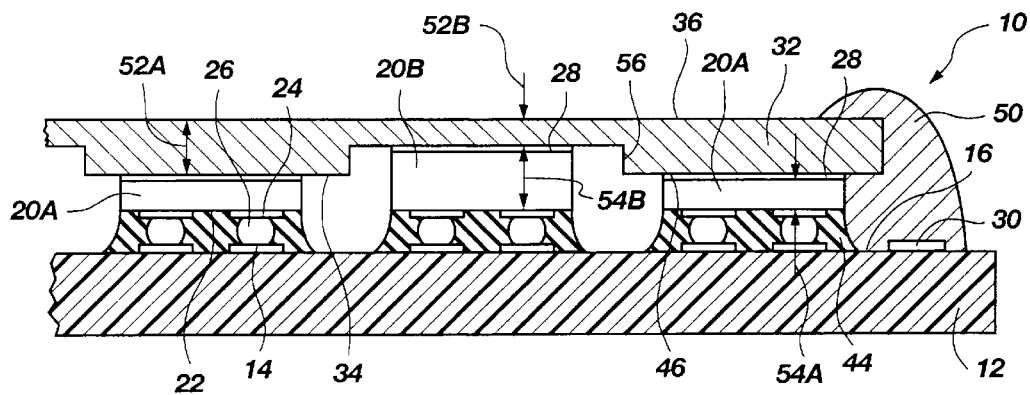
FIG. 4 is a cross-sectional view of a fourth preferred embodiment of a semiconductor device of the invention with multiple flip-chip dice of differing thicknesses mounted on a substrate and back-bonded to a single conductive backing plate having recesses formed therein for accommodating thicker dice to provide a common alignment face plane for all of the dice.

As shown in FIG. 4, a flip-chip semiconductor device 10 has a backing plate 32 which accommodates flip-chip semiconductor dice 20 of differing thicknesses in the same device. As illustrated, the thickness 54B of flip-chip semiconductor die 20B is greater than the thickness 54A of flip-chip semiconductor die 20A. A portion of the first side 34 of the backing plate 32 is formed with a recess 56 to accommodate the thicker flip-chip semiconductor die 20B. The backing plate 32 has a reduced thickness 52B over the recess 56 in comparison to the thickness 52A adjacent flip-chip semiconductor die 20A. Use of the recesses 56 enables the active surfaces 22 of all flip-chip semiconductor dice 20A, 20B, etc. to be aligned in a substantially coplanar manner. The backing plate 32 may be manipulated by automated machine to align all mounted flip-chip semiconductor dice 20 with the conductor pattern 14 and make all flip-chip electrical bonds therebetween simultaneously.

Figure 5:
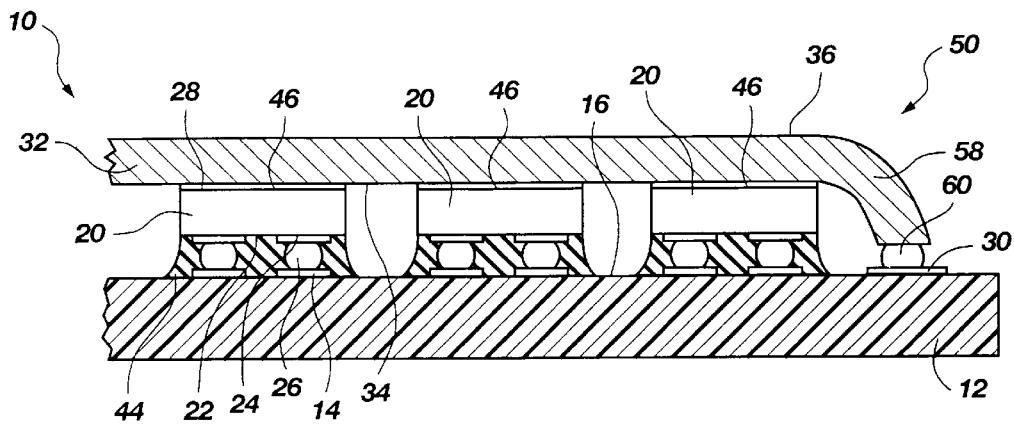
FIG. 5 is a cross-sectional view of a semiconductor device with multiple flip-chip dice mounted on a substrate and back-bonded to a single backing plate with an integral extension electrically connected to the substrate.

FIG. 5 shows another embodiment of fllip-chip semiconductor device 10 of the invention, wherein the backing plate 32 is formed with an integral extension 58 which is directed downwardly toward the reference potential connection 30 on the carrier substrate 12. The down-bond connection requires only a single bond 60 (between the extension 58 and the connection 30) for completion of the electrical ground or reference potential circuit for all of the flip-chip semiconductor dice 20 connected to the backing plate 32. Thus, use of the conductive backing plate 32 eliminates the need to provide a separate down-bond connection 50 for each flip-chip semiconductor die 20. Furthermore, the back sides 28 of flip-chip semiconductor dice 20 may be bonded to the first side 34 of the backing plate 32 with plate-to-die bonds 46 of conductive adhesive, and the single bond 60 may then be made simultaneously with the bonds between the input/output pads 24 of the active surfaces 22 and conductor pattern 14, eliminating a further step. As already indicated, the conductive bumps 26 as single well as bond 60 may comprise solder or a conductive polymeric material. Alternatively, the electrical connections between the backing plate 32 and the conductor pattern 14 of the carrier substrate 12 may be a conductive lead or leads of a TAB process. The backing plate 32 is preferably formed of a conductive metal, a metal alloy, or an insulated, rigid substrate (of any typical PCB material) faced on one or both sides with a metal sheet or film.

FIGS. 1–5 illustrate the die-to-substrate electrical connections as reflowed solder bumps 26, as known in the art. As noted previously, these connections may alternatively be made with conductive polymer, such as a conductive epoxy or metal-filled epoxy, which is then cured.

In some cases, the connections may be made with a conductive two-part polymeric material which is chemically self-curing at ambient temperatures. However, any useful electrical connection means may be used, including the aforementioned Z-axis anisotropic conductive adhesive film or tape.

Figure 6:
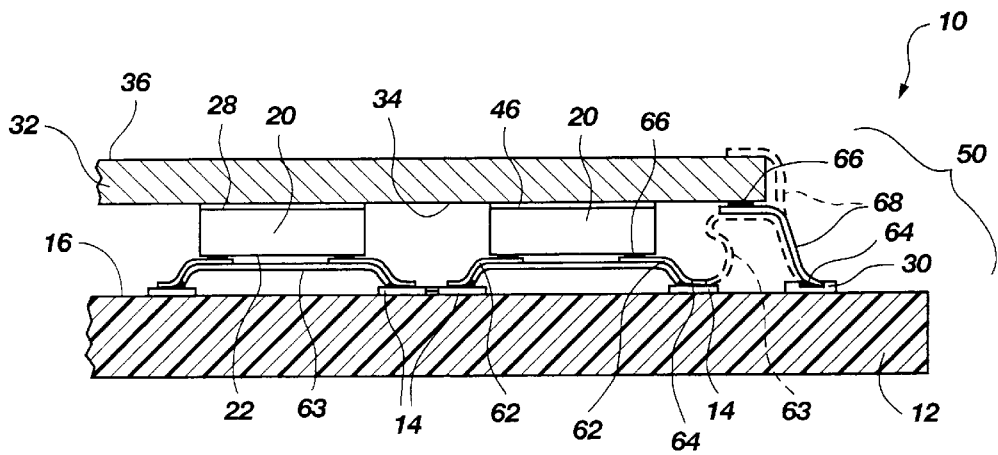
FIG. 6 is a cross-sectional view of a semiconductor device with flip-chip dice mounted on a substrate by tape automated bonding and back-bonded to a backing plate with a down-bond provided by a TAB connection.

As depicted in FIG. 6, a multiple die semiconductor device 10 includes a carrier substrate 12 having a metallization or conductor pattern 14 on first side 16. In this figure, the formation of electrical bonds to a large scale flip-chip device by tape automated bonding is illustrated.

Figure 6A:
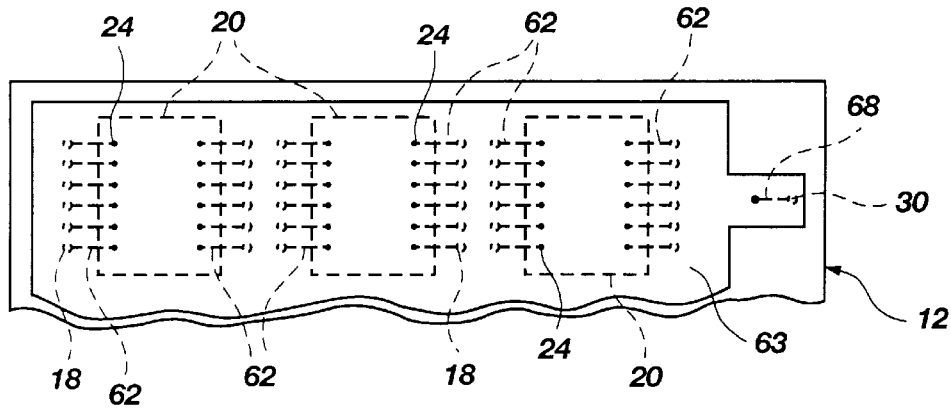
FIG. 6A is a top elevation of a lead pattern extending from a bond pad array to terminals of a conductor pattern on a carrier substrate.

A plurality of flip-chip semiconductor dice 20 have their active surfaces 22 facing the carrier substrate 12 and have leads 62 carried on a dielectric film 63 and attached by a conductive adhesive 66 (or alternatively by thermocompression bonding) in a tape automated bonding (TAB) process to bond pads on their active surfaces 22. The leads 62 are attached to the conductor pattern 14 by solder or conductive polymeric material 64, or by other means known in the art. While leads 62 have been shown in a vertically elongated position for clarity, it will be understood that ordinarily they would be substantially planar and lying close between the carrier substrate 12 and flip-chip semiconductor dice 20. A backing plate 32 covers the flip-chip semiconductor dice 20 of the multiple die semiconductor device 10; the dice are bonded to the first side 34 of the backing plate 32 at plate-to-die bonds 46 of conductive material. The figure further shows a down-bond connection 50 comprising a lead 68 (broken lines) which is bonded by conductive adhesive or solder 66 to the first side 34 or second side 36 (broken lines) of the backing plate. The lead 68 is also bonded to a reference potential connection 30 on the carrier substrate 12 by solder or conductive polymeric material to complete a second circuit, e.g. a ground or reference potential circuit. The lead 68 may comprise a discrete, self-supporting metal lead or a metal film carried on a polyimide or other dielectric film as employed in TAB processes. The configuration of FIG. 6 may have special utility in a situation where the bond pad pattern of a flip-chip semiconductor die 20 and the conductor pattern 14 of the carrier substrate 12 do not match. In such case, the TAB leads may be used as an adapter or bridge between the bond pads and the terminal ends of the conductor pattern 14. FIG. 6A is a top elevation of an exemplary pattern of leads 62 carried on dielectric film 63 and extending between an array of bond pads 24 and their associated input/output connection surfaces 18 of conductor pattern 14. The locations of flip-chip semiconductor dice 20 are shown superimposed in broken lines.

The lead or TAB connection may be used for the down-bond connection 50 regardless of the type of electrical bonding between the flip-chip semiconductor dice 20 and the substrate 12. Lead 68 may be attached to the backing plate 32 prior to or following attachment of TAB leads 62 to the flip-chip semiconductor dice 20 or at the same time if (as shown in broken lines) dielectric film 63 also carries lead 68.

Figure 7:
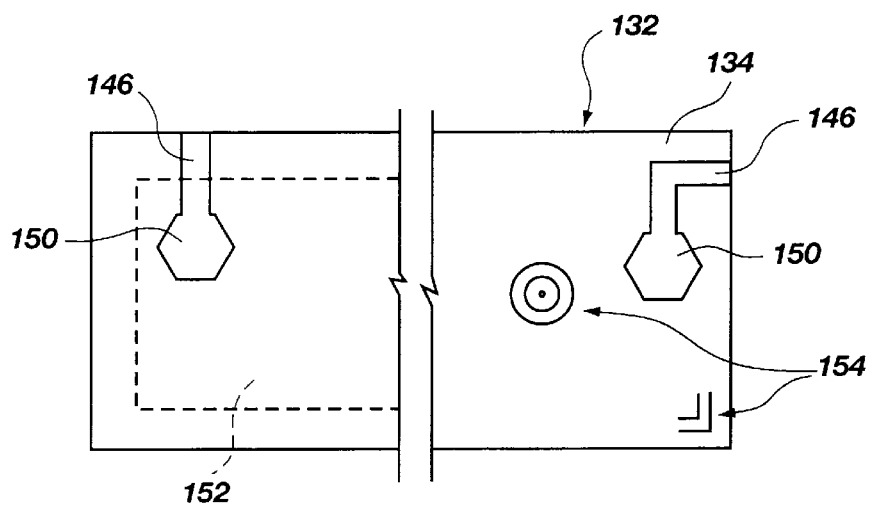
FIG. 7 is a top elevation of a multi-die backing plate according to the present invention including fiducial marks on the upper surface thereof.
Figure 8:
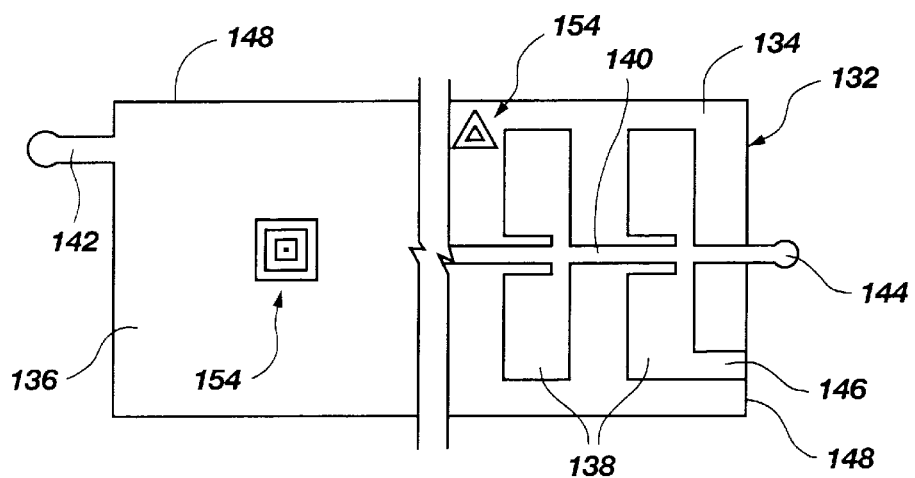
FIG. 8 is a bottom elevation of the backing plate of FIG. 7.

FIGS. 7 and 8 depict an embodiment of a backing plate 132 wherein a dielectric plate substrate 134 is employed, the dielectric comprising any suitable material including those previously mentioned herein for carrier substrates, and further including silicon having an oxidized or nitrided surface between the core of the substrate and metal sheet 136 carried on one surface thereof. Metal sheet 136 may cover dielectric plate substrate 134 as shown on the left-hand side of FIG. 8, or comprise a pattern of conductive die-attach pads 138 linked by connective traces 140, as shown on the right-hand side of FIG. 8. In either case, an integral extension such as 142 or 144 of the metal of the sheet 136 may be employed to form the reference, ground or test connection between backing plate 132 (and the die carried thereon) and a carrier substrate conductor. Further, another integral portion 146 of sheet 136 may wrap around an edge 148 of dielectric plate substrate 134 to provide a test pad 150 for probing by test equipment. In addition, dielectric plate substrate 134 may include a thermally-conductive core 152 to enhance heat transfer from the flip-chip semiconductor dice 20 mounted to the backing plate 132. Finally, precisely-placed fiducial marks 154 may be placed on at least one and preferably both sides of plate 132 (or any other plate 32) as previously described to promote precise relative alignment of the plate 132 and flip-chip semiconductor dice 20 for mutual bonding thereof, and of the plate/die assembly with the conductive pattern of a carrier substrate.

The major benefits of attaching a backing plate 32 (or 132) to the flip-chip semiconductor die or dice 20 are evident.

First, the flip-chip semiconductor die or dice 20 may be first bonded to the backing plate 32. The dice may then be manipulated through the die-to-substrate attachment steps by control of the backing plate, making alignment and bonding of the dice to the substrate faster, easier, and more precise. The method is especially advantageous for the manufacture of multiple-die devices such as MCMs and including even wafer scale assemblies having several thousands of integrated circuit dice.

Second, the backplate may provide a hard, rigid protective cover over the flip-chip semiconductor device to prevent damage to the assembled flip-chip semiconductor device 10, including the relatively fragile active surface electrical connections.

Third, the need for separate grounding or reference potential connections between each flip-chip semiconductor die 20 of a multiple-die device and the carrier substrate 12 is eliminated. A single grounding or down-bond reference connection 50 may be used, saving time and expense.

Fourth, a large second side 36 is provided for contact with a test probe.

Fifth, the backing plate 32 can act as a heat sink to prevent overheating of the dice, electrical connections and substrate during fabrication and operation.

Sixth, the method may be used with many types of die-to-substrate bonds, and in some cases the plate-to-substrate down-bond connection 50 may be made simultaneously with the die-to-substrate flip-chip bonds.

Seventh, the down-bond connection 50 may be a wire, a body of conductive or conductor-containing polymeric material, an integral extension of the backing plate 32, a discrete lead or a metal-on-film lead applied by a TAB process, or any other type conductive connection which will provide the necessary electrical connection.

The method is useful whether the down-bond connection 50 is used to establish a grounding circuit, reference potential circuit or other type of circuit.

It is anticipated that various changes and modifications may be made in the construction, arrangement, operation and method of construction of the invention disclosed herein without departing from the spirit and scope of the invention as defined in the following claims.

What is claimed is:

1. A method for fabricating a flip-chip semiconductor device from a flip-chip die having an active surface on a first side and an opposed surface on a second side, comprising the steps of:
   providing a conductive backing plate generally at least coextensive with said opposed surface;
   conductively bonding said second side of said die to said conductive backing plate;
   forming electrical connecting elements on said die active surface;
   aligning said die active surface with a conductor pattern of a carrier substrate for bonding said electrical connecting elements to conductors of said conductor pattern;
   bonding said electrical connecting elements of said active surface to said conductors of said conductor pattern; and
   forming an electrically conductive down-bond connection between said backing plate and a conductor of said carrier substrate to complete a circuit between said die second side and said conductor.

2. The method of claim 1, further comprising aligning said die active surface with said conductor pattern by machine manipulation of said backing plate.

3. The method of claim 1, further comprising the step of introducing a non-conductive polymer between said die active surface and said conductor pattern following bonding of said electrical connecting elements therebetween.

4. The method of claim 1, wherein the electrical connecting elements comprise metallic solder bumps, said solder bumps abutted against said conductor pattern of said carrier substrate and reflowed.

5. The method of claim 1, wherein the electrical connecting elements comprise bumps of conductive polymeric material and said bumps are abutted against said conductor pattern of said carrier substrate and cured.

6. The method of claim 1, wherein said down-bond connection is formed by wire-bonding a metal wire between said backing plate and a conductor of said conductor pattern.

7. The method of claim 1, wherein said down-bond connection is formed by application of a volume of conductive polymeric material extending between said backing plate and said conductor pattern and curing.

8. The method of claim 1, wherein formation of said down-bond connection includes conductive bonding of an integral extension of said backing plate to a conductor of said conductor pattern.

9. The method of claim 1, wherein formation of said down-bond connection comprises application of a conductive TAB lead to said backing plate, and bonding of said conductive TAB lead to a conductor of said conductor pattern.

10. The method of claim 1, wherein bonding said electrical connecting elements to said conductor pattern and forming said down-bond connection to said conductor of said carrier substrate are performed substantially simultaneously.

11. A method for fabricating a flip-chip semiconductor device from a plurality of flip-chip dice, comprising the steps of:
    providing a carrier substrate having a conductor pattern configured for electrical attachment to a plurality of flip-chip dice;
    providing a conductive backing plate with first and second sides;
    providing a plurality of flip-chip dice, each of said plurality of dice having a die active surface carrying electrical connection elements on a first side and an opposed surface on a second side;
    conductively bonding said second side of each of said plurality of dice to said second side of said conductive backing plate;
    aligning said die active surfaces with the conductor pattern of said carrier substrate for bonding said electrical connection elements to said conductor pattern;
    bonding said electrical connection elements of said die active surfaces to said conductor pattern of said carrier substrate; and
    forming an electrically conductive down-bond connection between said first side of said backing plate and a conductor of said conductor pattern to complete a circuit therebetween.

12. The method of claim 11, wherein said die active surfaces are aligned with said conductor pattern by machine manipulation of said backing plate.

13. The method of claim 12, wherein said electrical connection elements are bonded to said conductor pattern simultaneously with said formation of said down-bond connection.

14. A method for fabricating a flip-chip semiconductor device comprising the steps of:
    providing at least one flip-chip semiconductor die having a die active surface on a first side and an opposed surface on a second side,
    forming electrical connecting elements on said die active surface;
    providing a conductive backing plate substantially coextensive with said opposed surface;
    conductively bonding said opposed surface of said second side of said at least one flip-chip semiconductor die to said conductive backing plate;
    providing a carrier substrate having a plurality of conductors forming a conductor pattern;
    aligning said die active surface with said conductor pattern of said carrier substrate for bonding said electrical connecting elements to conductors of said conductor pattern;
    bonding said electrical connecting elements of said active surface to said conductors of said conductor pattern; and
    forming an electrically conductive down-bond connection between said conductive backing plate and a conductor of said carrier substrate to complete a circuit between said die second side and said conductor.

15. The method of claim 14, further comprising aligning said die active surface with said conductor pattern by machine manipulation of said backing plate.

16. The method of claim 14, further comprising the step of introducing a non-conductive polymer between said die active surface and said conductor pattern following bonding of said electrical connecting elements therebetween.

17. The method of claim 14, wherein the electrical connecting elements comprise metallic solder bumps, said solder bumps abutted against said conductor pattern of said carrier substrate and reflowed.

18. The method of claim 14, wherein the electrical connecting elements comprise bumps of conductive polymeric material and said bumps are abutted against said conductor pattern of said carrier substrate and cured.

19. The method of claim 14, wherein said down-bond connection is formed by wire-bonding a metal wire between said backing plate and a conductor of said conductor pattern.

20. The method of claim 14, wherein said down-bond connection is formed by application of a volume of conductive polymeric material extending between said backing plate and said conductor pattern and curing.

* * * * *

UNITED STATES PATENT AND TRADEMARK OFFICE
CERTIFICATE OF CORRECTION

PATENT NO.    : 6,121,070
DATED         : September 19, 2000
INVENTOR(S)   : Salman Akram It is certified that error appears in the above-identified patent and that said Letters Patent is hereby corrected as shown below:

Column 5,
Line 34, change "corner substrate 12" to -- carrier substrate 12 --.

Column 6,
Line 54, change "fllip-chip" to -- flip-chip --.

Column 7,
Line 5, change "as single well as bond 60" to -- as well as single bond 60 --.

Signed and Sealed this

Second Day of May, 2006

JON W. DUDAS
*Director of the United States Patent and Trademark Office*